United States Patent
Chen

(10) Patent No.: US 9,825,197 B2
(45) Date of Patent: Nov. 21, 2017

(54) METHOD OF FORMING A BUFFER LAYER IN A SOLAR CELL, AND A SOLAR CELL FORMED BY THE METHOD

(71) Applicant: TSMC Solar Ltd., Taichung (TW)

(72) Inventor: Shih-Wei Chen, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1005 days.

(21) Appl. No.: 13/781,920

(22) Filed: Mar. 1, 2013

(65) Prior Publication Data
US 2014/0246093 A1 Sep. 4, 2014

(51) Int. Cl.
*H01L 31/18* (2006.01)
*H01L 31/0296* (2006.01)
*H01L 31/0749* (2012.01)
*H01L 21/02* (2006.01)

(52) U.S. Cl.
CPC .... *H01L 31/1828* (2013.01); *H01L 21/02425* (2013.01); *H01L 21/02485* (2013.01); *H01L 21/02551* (2013.01); *H01L 21/02568* (2013.01); *H01L 21/02614* (2013.01); *H01L 31/02966* (2013.01); *H01L 31/0749* (2013.01); *Y02E 10/541* (2013.01); *Y02E 10/543* (2013.01)

(58) Field of Classification Search
CPC ........... H01L 31/1828; H01L 21/02614; H01L 21/02568; H01L 21/02485; H01L 21/02551; H01L 21/02425; H01L 31/0749; H01L 31/02966; Y02E 10/50
See application file for complete search history.

(56) References Cited

U.S. PATENT DOCUMENTS

| | | | |
|---|---|---|---|
| 6,092,669 A * | 7/2000 | Kushiya | H01L 31/0322 204/192.25 |
| 7,319,190 B2 | 1/2008 | Tuttle | |
| 8,525,021 B2 | 9/2013 | Eaglesham | |
| 8,748,216 B2 * | 6/2014 | Guo | H01L 21/02568 257/E31.026 |
| 2006/0096537 A1 | 5/2006 | Tuttle | |
| 2009/0032094 A1* | 2/2009 | Aoki | H01L 31/0322 136/256 |

(Continued)

FOREIGN PATENT DOCUMENTS

| | | |
|---|---|---|
| CN | 101094726 A | 12/2007 |
| CN | 101772845 A | 7/2010 |

(Continued)

OTHER PUBLICATIONS

Official Action dated Apr. 22, 2015 in counterpart Taiwan Patent Application.

(Continued)

*Primary Examiner* — Michelle Mandala
(74) *Attorney, Agent, or Firm* — Duane Morris LLP

(57) ABSTRACT

A method of fabricating a buffer layer of a photovoltaic device comprises: providing a substrate having a back contact layer disposed above the substrate and an absorber layer disposed above the back contact layer; depositing a metal layer on the absorber layer; and performing a thermal treatment on the deposited metal layer in an atmosphere comprising sulfur, selenium or oxygen, to form a buffer layer.

20 Claims, 7 Drawing Sheets

(56) References Cited

U.S. PATENT DOCUMENTS

2009/0258457 A1* 10/2009 Britt .................... C23C 18/1204
                                                            438/95
2010/0075457 A1    3/2010 Hsieh
2012/0034726 A1*  2/2012 Britt .................... C23C 18/1204
                                                            438/62

FOREIGN PATENT DOCUMENTS

CN       102254998 A    11/2011
TW       201013945 A     4/2010

OTHER PUBLICATIONS

"Rapid Thermal Processing", retrieved from Wikipedia, http://en.wikipedia.org/wiki/Rapid_thermal_processing.

Vidal, J. et al., "Influence of magnetic field and type of substrate on the growth of ZnS films by chemical bath", Thin Solid Films, 2002, 419:118-123.

Singh, U.P. et al., Review Article "Progress in Polylcrystalline Thin-Film Cu(In,Ga) Se2, Solar Cells", Hindawi Publishing Corporation, International Journal of Photoenergy, 2010, vol. 2010, Article ID 468147, 19 pages.

* cited by examiner

METHOD OF FORMING A BUFFER LAYER IN A SOLAR CELL, AND A SOLAR CELL FORMED BY THE METHOD

FIELD

This disclosure relates to thin-film solar cell fabrication processes.

BACKGROUND

Solar cells are photovoltaic components for direct generation of electrical current from sunlight. A number of solar cells are provided on a substrate that may be referred to as a solar cell substrate, a solar panel, or a solar module. The solar cell substrate captures energy from sunlight. Photons in sunlight hit the solar cells and are absorbed by semiconductor materials such as $Cu(In,Ga,)Se_2$ (CIGS), (silicon, or other absorber materials. Negatively charged electrons are released from their atoms by the photons, causing an electric potential difference. Current starts flowing through the solar cell material to cancel the potential difference and this electricity is captured. The electricity produced by a multitude of solar cells on the solar cell substrate is harnessed and coupled to a power cable.

A variety of solar energy collecting modules currently exists. The solar energy collecting modules can have different geometries and be formed of different materials, but generally include large, flat solar panels and include a back contact layer, an absorber layer, a buffer layer and a front contact layer. The buffer layer can comprise a material such as CdS, and is used to produce a reproducible and efficient heterojunction in thin film solar cells. CdS buffer layers also find application in other types of solar cells.

$Cu(In,Ga)Se_2$ (CIGS) type solar cells. CIGS solar cells use a CIGS absorber layer, and buffer layer (e.g., CdS) disposed between the absorber layer and a ZnO window layer. Integrating a CdS layer into the ZnO/CIGS system enhances the spectral absorption of the solar cell, since the refractive index of CdS ($n_r$~2.4) lies between the refractive indices of ZnO ($n_r$~1.9) and CIGS ($n_r$~2.9). The large step between the refractive indices of ZnO and CIGS is therefore divided into two smaller steps resulting in an overall reduced reflectivity of the solar cell. Thus, the quality of the buffer layer affects in overall solar cell performance.

DETAILED DESCRIPTION

Figure 1A:
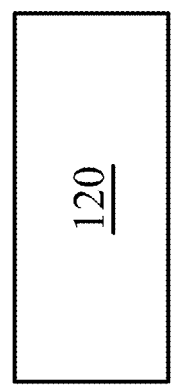
FIGS. 1A-1C show three steps in formation of a buffer layer for a photovoltaic solar cell according to some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the device be constructed or operated in a particular orientation.

A method is disclosed for forming an n type semiconductor for the buffer layer of a solar cell. This buffer layer is formed by pre-depositing a specific metal on an absorber layer above a substrate. Subsequently the substrate is placed in a furnace to perform sulfurization, selenization or oxidation. The p-n junction is formed by this annealing process. This method reduces or avoids damage of the p-n junction, because the junction is not established until after completing the metal deposition for the buffer layer. In addition, the subsequent annealing process can passivate defects (such as selenium vacancy).

Figure 1B:
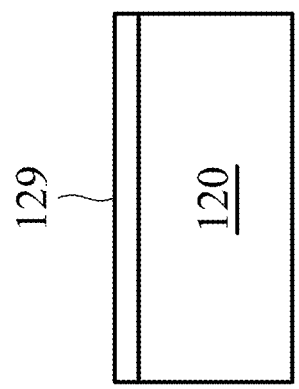
Figure 1C:
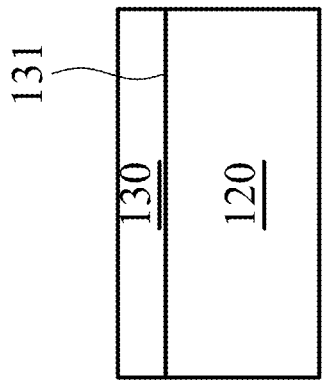
Figure 2:
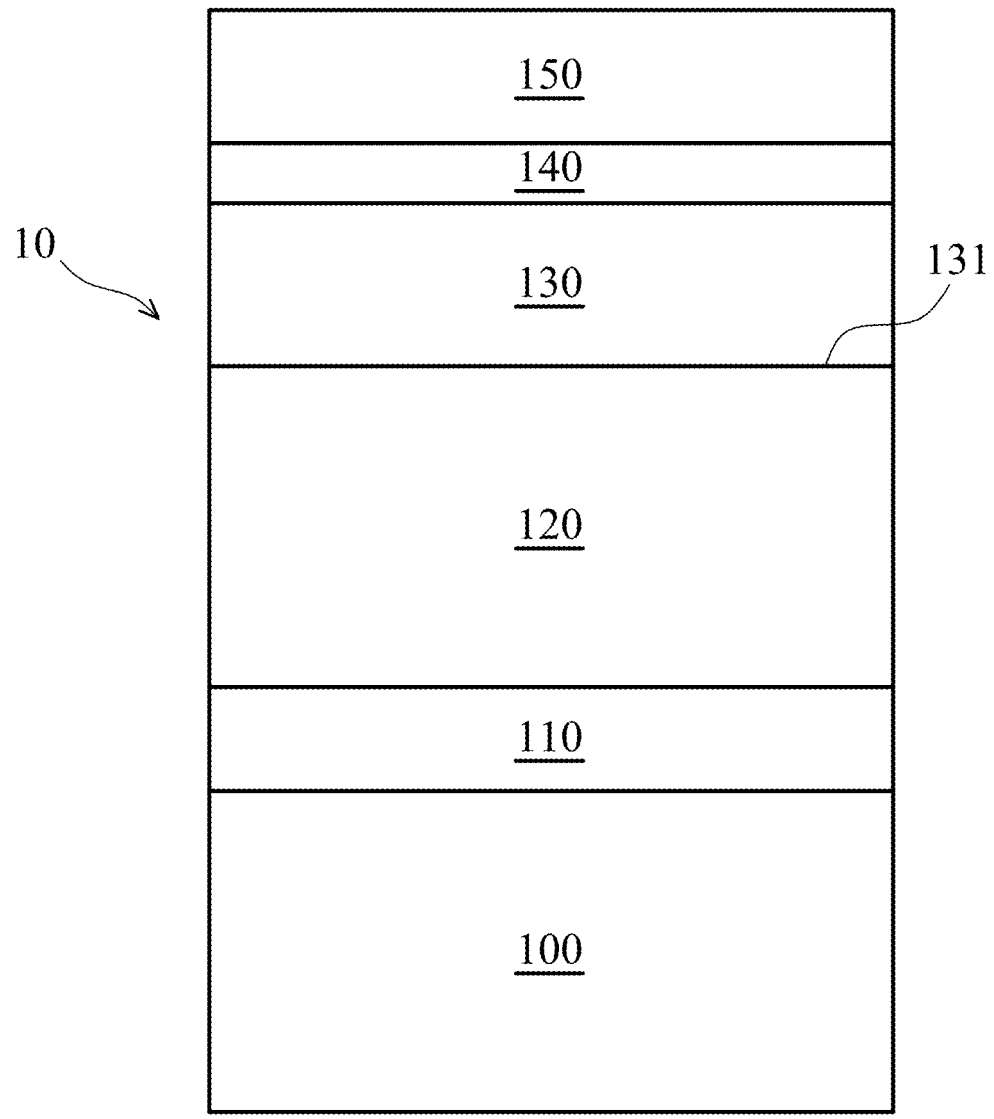
FIG. 2 is a cross sectional view of a solar cell including the buffer layer of FIG. 1.
Figure 4:
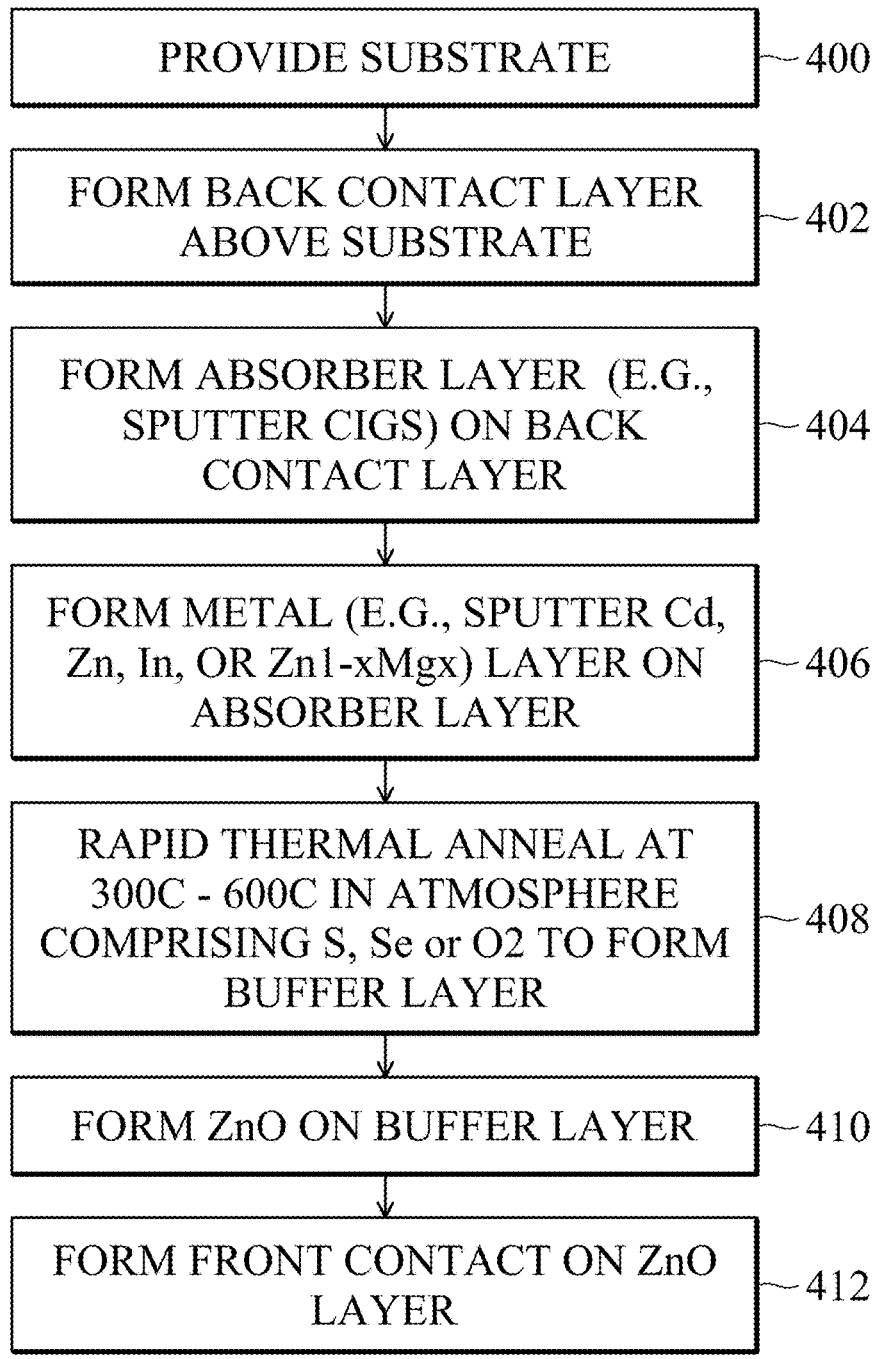
FIG. 4 is a flow chart of a method of fabricating the solar cell of FIG. 2.

FIGS. 1A-1C show the absorber and buffer layers at different steps of processing, in a method of fabricating a buffer layer 130 of a photovoltaic device 10. FIG. 2 shows the completed photovoltaic device 10. FIG. 4 is a flow chart of a method according to some embodiments.

At step 400 of FIG. 4, a substrate 100 (FIG. 2) is provided. In some embodiments, the substrate 100 is a glass substrate, such as soda lime glass. In other embodiments, the substrate 100 is a flexible metal foil or polymer (e.g., polyimide). In some embodiments, the substrate 100 has a thickness in a range from 0.1 mm to 5 mm.

At step 402 of FIG. 4, a back contact 110 (FIG. 2) is formed above the substrate 100. In some embodiments, the back contact 110 is formed of molybdenum (Mo) above which a CIGS absorber layer can be formed. In some embodiments, the Mo back contact 110 is formed by sputtering. Other embodiments include other suitable back contact materials. such as Pt, Au, Ag, Ni, or Cu, instead of Mo. For example, in some embodiments, a back contact layer of copper or nickel is provided, above which a cadmium telluride (CdTe) absorber layer can be formed. Following formation of the back contact layer 110, the P1 scribe line is formed in the contact layer.

At step 404 of FIG. 4, an absorber, such as a p-type absorber 120 (FIG. 2) is formed on the back contact 110. In some embodiments, the absorber layer 120 is a chalcopyrite-based absorber layer comprising Cu(In,Ga)Se$_2$ (CIGS), having a thickness of about 1 micrometer or more. In some embodiments, the absorber layer 120 is sputtered using a CuGa sputter target (not shown) and an indium-based sputtering target (not shown). In some embodiments, the CuGa material is sputtered first to form one metal precursor layer and the indium-based material is next sputtered to form an indium-containing metal precursor layer on the CuGa metal precursor layer. In other embodiments, the CuGa material and indium-based material are sputtered simultaneously, or on an alternating basis.

Other embodiments form the absorber layer by a different technique that provides suitable uniformity of composition. For example the Cu, In, Ga and Se$_2$ can be coevaporated and simultaneously delivered by chemical vapor deposition (CVD) followed by heating to a temperature in the range of 400° C. to 600° C. In other embodiments, the Cu, In and Ga are delivered first, and then the absorber layer is annealed in an Se atmosphere at a temperature in the range of 400° C. to 600° C.

In other embodiments, the absorber comprises different materials, such as CuInSe$_2$ (CIS), CuGaSe$_2$ (CGS), Cu(In, Ga)Se$_2$ (CIGS), Cu(In,Ga)(Se,S)$_2$ (CIGSS), CdTe and amorphous silicon. Other embodiments include still other absorber layer materials.

FIG. 1A shows the substrate at the completion of providing a substrate 100 having a back contact layer 110 disposed above the substrate 100 and an absorber layer 120 disposed above the back contact layer 110.

In some embodiments, the formation of buffer layer 130 is divided into a two-part process. At step 406 of FIG. 4, during the first step, a metal layer 129 is deposited on the absorber layer 120 as shown in FIG. 1B, prior to forming the p-n junction. At the completion of the first step, the interface between the absorber layer 120 and the metal layer 129 is completely covered with 1 nm to 1000 nm of metal. In some embodiments, the thickness of the metal layer 129 at the completion of the first step is in a range from 5 nm to 500 nm. In some embodiments, the metal layer comprises one of the group consisting of cadmium, zinc, indium and Zn$_{1-x}$Mg$_x$.

At step 408 of FIG. 4, during the second step, a thermal treatment is performed on the deposited metal layer 129 (FIG. 1B) in an atmosphere comprising sulfur, selenium or oxygen, to form a buffer layer 130 (FIG. 1C). FIG. 1C shows the absorber layer 120 with the annealed buffer layer 130 on its top surface. The p-n junction 131 is formed during the annealing (second) step, after the absorber layer 120 is covered with the metal 129 in the first step.

In some embodiments, the thermal treatment is a rapid thermal anneal (RTA) process performed in an atmosphere comprising sulfur, selenium or oxygen at a temperature in the range of 400° C. to 600° C. The choice of the atmosphere composition and temperature depends on the composition and thickness of the metal layer 129.

In some embodiments, the metal layer 129 comprises cadmium, and the atmosphere comprises at least one of the group consisting of sulfur and H$_2$S. The resulting buffer layer 130 comprises CdS.

In some embodiments, the metal layer 129 comprises zinc, and the atmosphere comprises at least one of the group consisting of sulfur and H$_2$S. The resulting buffer layer 130 comprises ZnS.

In some embodiments, the metal layer 129 comprises indium, and the atmosphere comprises at least one of the group consisting of sulfur and H$_2$S. The resulting buffer layer 130 comprises In$_2$S$_3$.

In some embodiments, the metal layer 129 comprises indium, and the atmosphere comprises at least one of the group consisting of selenium and H$_2$Se. The resulting buffer layer 130 comprises In$_2$Se$_3$.

In some embodiments, the metal layer 129 comprises Zn$_{1-x}$Mg$_x$, and the atmosphere comprises oxygen. The resulting buffer layer 130 comprises Zn$_{1-x}$Mg$_x$O.

In some embodiments, the atmosphere during the RTA process comprises one of the group consisting of sulfur, selenium, H$_2$S, H$_2$Se, and O$_2$; and the atmosphere further comprises an inert gas, such as nitrogen, argon, or other noble gas.

The RTA process transforms the metal layer 129 into the buffer layer 130. The buffer layer 130 has a thickness in a range from 13 nm to 1300 nm. The final thickness depends in part on which annealing gas is used.

Following the RTA process, the P2 scribe line is formed in the contact layer.

At step 410 of FIG. 4, following the RTA step, in some embodiments, a non-doped intrinsic zinc oxide (i-ZnO) layer 140 (FIG. 2), is formed on the buffer layer 130. The ZnO can be deposited by metal organic chemical vapor deposition (MOCVD), sputtering, atomic layer deposition (ALD) or other suitable method. A third (P3) scribe line is then formed.

At step 412 of FIG. 4, the front contact 150 (FIG. 2) is then formed on the ZnO layer above the buffer layer 130. The front contact can be tin doped In$_2$O$_3$ (ITO), RF-sputtered Al-doped ZnO, or other suitable transparent conducting oxide (TCO).

The final photovoltaic device 10, as shown in FIG. 2 comprises: a substrate 100, a back contact layer 110 above the substrate 100, an absorber layer 120 on the back contact layer 110, a buffer layer 130 on the absorber layer 120, an undoped ZnO layer 140 on the buffer layer 130, and a front contact layer 150 on the ZnO layer 140 above the buffer layer.

The p-n junction 131 is not formed by the metal layer 129 deposition. Rather, the p-n junction 131 is formed when the metal layer 129 is converted to the n-type buffer layer 130 during the anneal. Thus, the p-n junction 131 is not susceptible to damage by the process used to deposit the metal layer 129. Thus, a fast, uniform process such as sputtering with a high cathode voltage can be used to deposit metal layer 129, without damaging the p-n junction. In some embodiments, the sputtered metal layer provides highly uniform metal thickness and composition. In other embodiments, the metal layer is deposited by another process such as chemical bath deposition or atomic layer deposition.

FIGS. 3A-3D show another aspect of the compositional features of a photovoltaic cell 100 formed by the method described above.

Figure 3A:
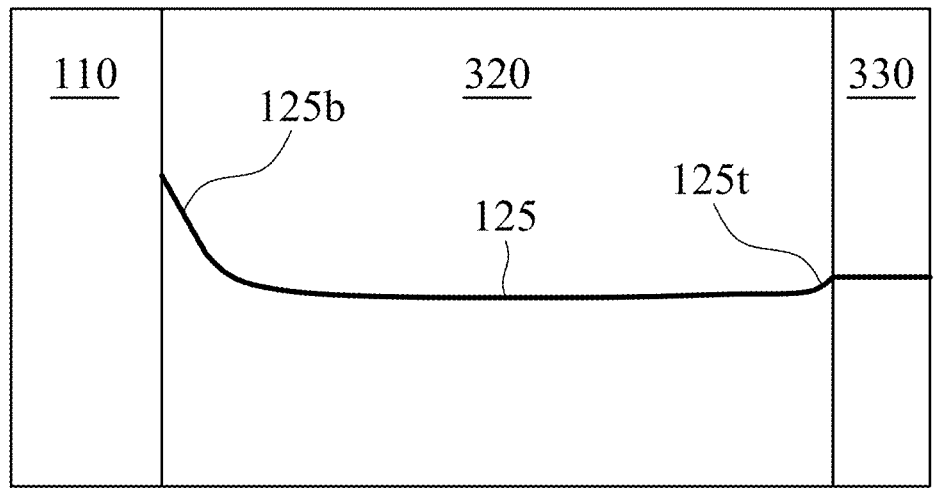
FIG. 3A shows the sulfur atomic percentage profile of the absorber layer of a solar cell having a buffer layer formed by a one step process including p-n junction formation, where the absorber layer initially comprises a sulfur containing compound.

FIG. 3A shows the sulfur atomic percentage profile 125 of the absorber layer 320 of a solar cell having a buffer layer 330 formed by a one step process including p-n junction formation, where the absorber layer initially comprises a sulfur containing compound such as Cu(InGa)SeS. For example, such a process can deposit a CdS buffer layer in one step by sputtering, ALD or chemical bath deposition (CBD). The spectral sulfur signal 125 monitored from the back electrode 110 to the buffer layer 330 shows that the atomic percentage of sulfur within the absorber layer 320 is fairly flat throughout the absorber layer, except in a region near the interface between the absorber 320 and the back electrode 110, where the atomic percentage 125b is substantially greater than throughout the rest of the absorber. In various embodiments, the ratio of the sulfur atomic percentage at the interface 125b to the sulfur atomic percentage at the interface 125t is from 1.5 to 3, depending on the degree of sulfurization in the absorber formation process.

Figure 3B:
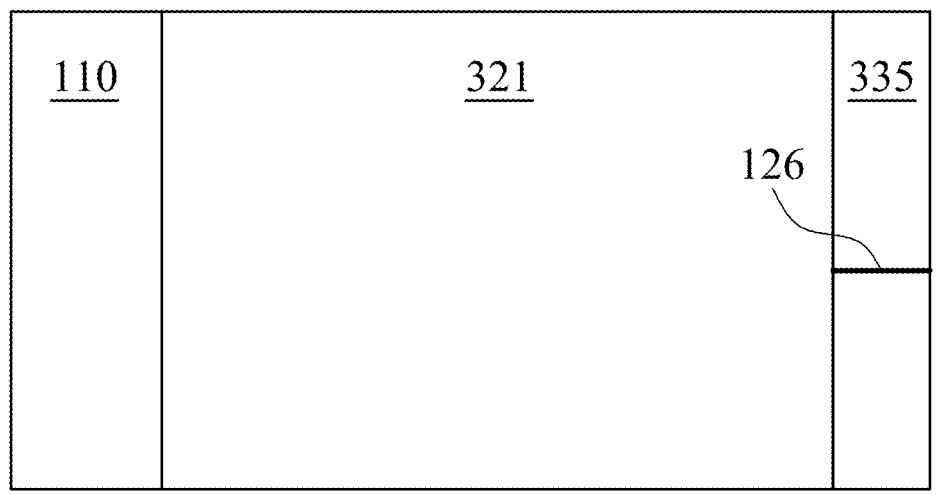
FIG. 3B shows the sulfur atomic percentage profile of the absorber layer of a solar cell having a buffer layer formed by a one step process including p-n junction formation, where the absorber layer initially excludes any a sulfur containing compound.

FIG. 3B shows the sulfur atomic percentage profile 126 of the absorber layer 321 of a solar cell having a buffer layer 335 formed by a one step process including p-n junction formation, where the absorber layer initially excludes any a sulfur containing compound, such as Cu(InGa)Se. For example, such a process can deposit a CdS buffer layer in one step by sputtering, ALD or chemical bath deposition (CBD). The spectral sulfur signal 126 monitored from the back electrode 110 to the buffer layer 335 shows no sulfur within the absorber layer 321.

Figure 3C:
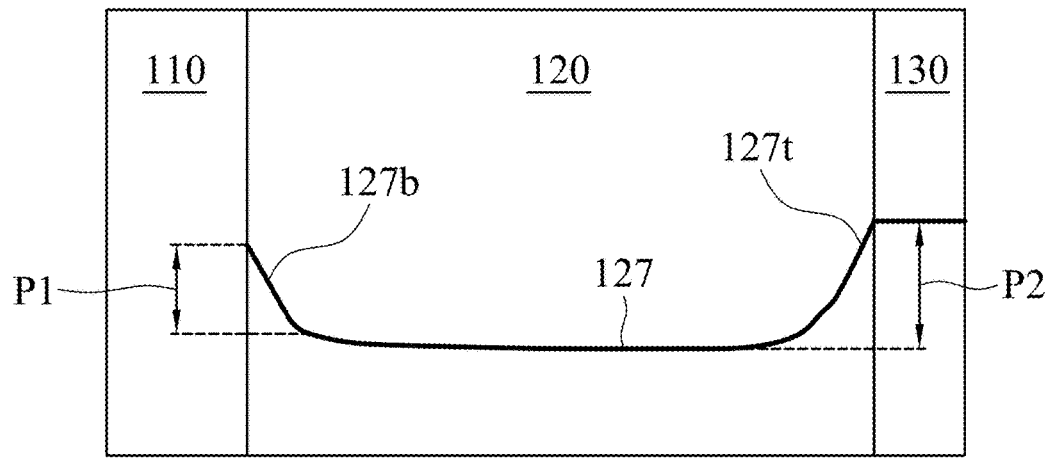
FIG. 3C shows the sulfur atomic percentage profile of the absorber layer of the solar cell of FIG. 2 for an absorber material initially comprising a sulfur containing compound.

FIG. 3C shows the sulfur atomic percentage profile 127 of the absorber layer 120 of the solar cell of FIG. 2 (formed by the method of FIG. 4) for an absorber material initially comprising a sulfur containing compound. For example, in some embodiments, the absorber 120 comprises Cu(InGa)SeS. The spectral sulfur signal 127 shows that the atomic percentage of sulfur within the absorber layer 120 is fairly flat throughout the absorber layer, except in a region 127b near the interface between the absorber 120 and the back electrode 110, and in a region 127t near the interface between the absorber 120 and the buffer layer 130. In both the regions 127b and 127t, the sulfur atomic percentage 127b is substantially greater than throughout the rest of the absorber 120. The ratio of the sulfur atomic percentage at the interface 127b to the sulfur atomic percentage at the interface 127t can be less than 1.0, depending on the degree of sulfurization in the buffer layer annealing process (step 408, FIG. 4). That is, in the profile, the percentage P2 of the sulfur atomic percentage profile is greater than the percentage P1.

Figure 3D:
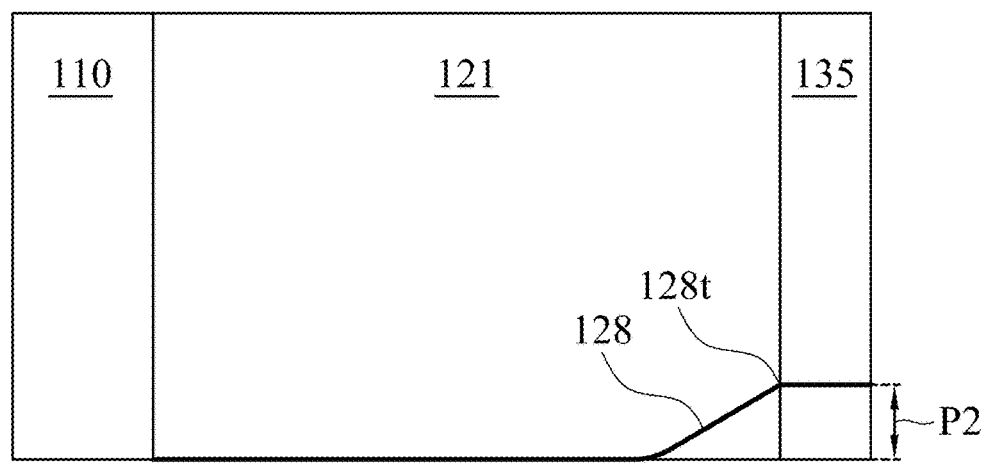
FIG. 3D shows the sulfur atomic percentage profile of the absorber layer of the solar cell of FIG. 2 for an absorber material initially excluding any sulfur containing compound.

FIG. 3D shows the sulfur atomic percentage profile of the absorber layer 121 of the solar cell of FIG. 2 for an absorber material initially excluding any sulfur containing compound, such as Cu(InGa)Se. The spectral sulfur signal 128 shows no sulfur throughout the absorber layer, except in a region 128t near the interface between the absorber 121 and the buffer layer 135. In the region 128t, the sulfur atomic percentage 128 is substantially greater than throughout the rest of the absorber 121, as shown by the percentage P2.

Thus, in some embodiments, solar cells processed using the two step process (steps 406 and 408 of FIG. 4), the absorber has an elemental sulfur atomic percentage that is greater at an interface between the absorber layer and the buffer layer than the elemental sulfur atomic percentage at an interface between the absorber layer and the back contact layer.

In other embodiments, depending on the degree of sulfurization in the absorber formation process, the percentage P2 of the sulfur atomic percentage profile is approximately the same as the percentage P1, and may be slightly less than P1 in some cases.

Figure 3E:
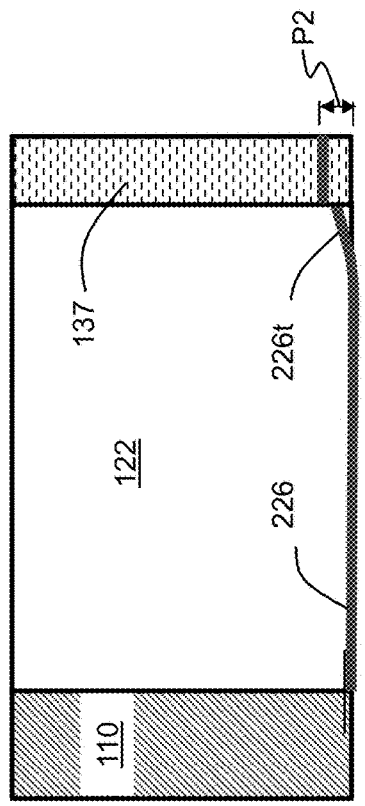
FIG. 3E shows oxygen atomic percentage profile of the absorber layer of a solar cell having a buffer layer formed by a one step process including p-n junction formation.
Figure 3F:
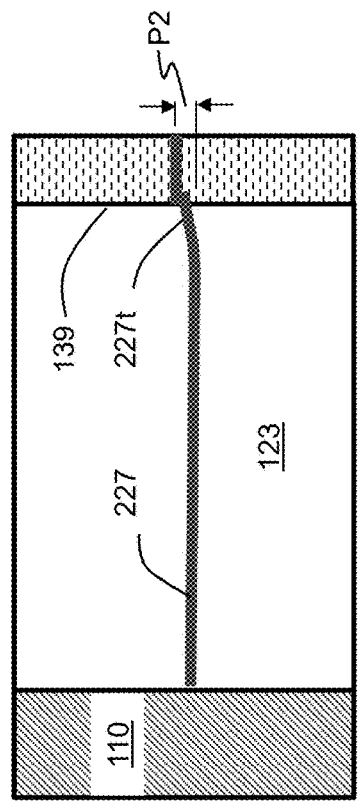
FIG. 3F shows oxygen atomic percentage profile of the absorber layer of a solar cell having a buffer layer formed by a two-step process including metal deposition and rapid thermal annealing in an oxygen atmosphere.

FIGS. 3E and 3F show an analogous result when an oxygen atmosphere is used. FIG. 3E shows a device including a back electrode layer 110, an absorber 322 comprising Cu(InGa)Se or Cu(InGa)SeS, and a buffer layer 337 formed by a one step process including p-n junction formation. The absorber layer initially excludes oxygen. There is no spectral oxygen signal in the absorber layer. The spectral oxygen signal only appears in the Zn1-xMgxO buffer layer.

FIG. 3F shows a device including a back electrode layer 110, an absorber 122 comprising Cu(InGa)Se or Cu(InGa)SeS (initially excluding oxygen), and a buffer layer 137 formed by a two-step process including metal deposition and RTA in an oxygen atmosphere, as described above. The spectral oxygen signal 226 shows no oxygen throughout the absorber layer 122, except in a region 226t near the interface between the absorber 122 and the buffer layer 137. In the region 226t, the oxygen atomic percentage 228 is substantially greater than throughout the rest of the absorber 122, as shown by the percentage P2. Thus, oxygen diffusion into the surface of the CIGS absorber 122 is observed.

Figure 3G:
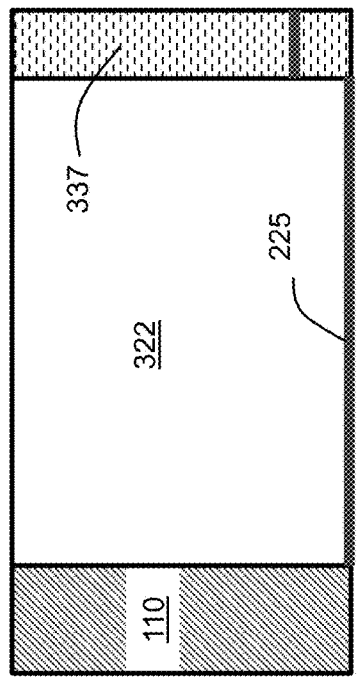
FIG. 3G shows selenium atomic percentage profile of the absorber layer of a solar cell having a buffer layer formed by a one step process including p-n junction formation.
Figure 3H:
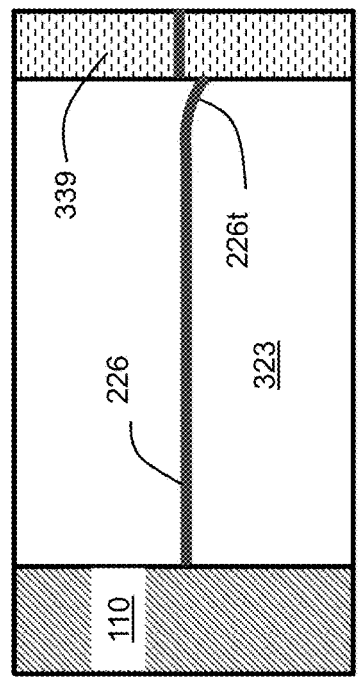
FIG. 3H shows selenium atomic percentage profile of the absorber layer of a solar cell having a buffer layer formed by a two-step process including metal deposition and rapid thermal annealing in a selenium atmosphere.

FIGS. 3G and 3H show an analogous result when a selenium atmosphere is used. FIG. 3G shows a device including a back electrode layer 110, an absorber 323 comprising Cu(InGa)SeS, and an $In_2Se_3$ buffer layer 339 formed by a one step process including p-n junction formation. The absorber layer 323 initially includes selenium throughout the absorber, but the atomic percentage of selenium drops near the interface between the absorber and the buffer layer 339 (due to sulfur incorporation, which replaces some selenium atoms). Thus, the spectral selenium signal 226 in the absorber layer 323 is flat, except at the surface of the absorber layer 323 near the buffer layer 339, where the selenium atomic percentage 226t is lower. It is noted that when the absorber layer is Cu(InGa)Se and the atmosphere is selenium, the one step buffer layer process provides a flat selenium profile throughout.

FIG. 3H shows a device including a back electrode layer 110, an absorber 123 comprising Cu(InGa)SeS, and an $In_2Se_3$ buffer layer 139 formed by a two-step process including metal deposition and RTA in an oxygen atmosphere, as described above. The spectral selenium signal 227 is flat throughout the absorber layer 122, except in a region 227t near the interface between the absorber 123 and the buffer layer 139. In the region 227t, the selenium atomic percentage 227t is restored to be slightly greater than throughout the rest of the absorber 123, as shown by the percentage P2. Thus, selenium diffusion into the surface of the CIGS absorber 122 is observed, again replacing the sulfur. It is noted that when the absorber layer is Cu(InGa)Se and the atmosphere is selenium, the two step buffer layer process provides a substantially flat selenium profile throughout.

Figure 5:
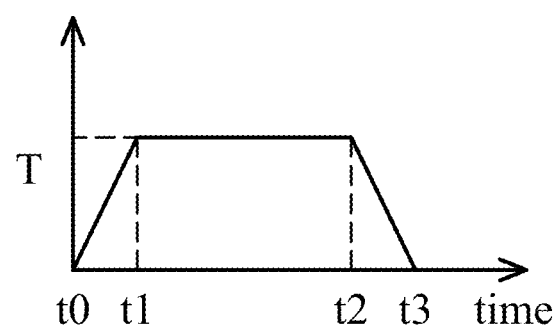
FIG. 5 is a schematic timeline of the rapid thermal anneal process of FIG. 4.

FIG. 5 shows an example of a temperature profile during the thermal treatment of step 408 (FIG. 4). The temperature is rapidly increased to an annealing temperature T in the range from 300° C. to 600° C. between time t0 and time t1. The substrate remains at the annealing temperature T from t1 to t2. Between times t2 and t3, the temperature is reduced. The rapid thermal anneal is performed quickly. For example, a wafer can be annealed within a period of several minutes, or as short a period as about 1 minute to about 2 minutes.

The method and devices described herein can be incorporated in a variety of configurations.

In some embodiments, a method of fabricating a buffer layer of a photovoltaic device comprises: providing a substrate having a back contact layer disposed above the substrate and an absorber layer disposed above the back contact layer; depositing a metal layer on the absorber layer; and performing a thermal treatment on the deposited metal layer in an atmosphere comprising sulfur, selenium or oxygen, to form a buffer layer.

In some embodiments, the metal layer comprises one of the group consisting of cadmium, zinc, indium and $Zn_{1-x}Mg_x$.

In some embodiments, the metal layer comprises cadmium, and the atmosphere comprises at least one of the group consisting of sulfur and $H_2S$.

In some embodiments, the metal layer comprises zinc, and the atmosphere comprises at least one of the group consisting of sulfur and $H_2S$.

In some embodiments, the metal layer comprises indium, and the atmosphere comprises at least one of the group consisting of sulfur and $H_2S$.

In some embodiments, wherein the metal layer comprises indium, and the atmosphere comprises at least one of the group consisting of selenium and $H_2Se$.

In some embodiments, wherein the metal layer comprises $Zn_{1-x}Mg_x$, and the atmosphere comprises oxygen.

In some embodiments, the step of depositing a metal layer on the absorber layer includes depositing from 1 nm to 1000 nm of metal.

In some embodiments, the step of depositing a metal layer on the absorber layer includes depositing from 5 nm to 500 nm of metal.

In some embodiments, the buffer layer has a thickness in a range from 13 nm to 1300 nm.

In some embodiments, the atmosphere further comprises an inert gas.

In some embodiments, the thermal treatment is a rapid thermal anneal.

In some embodiments, the rapid thermal anneal is performed at a temperature from 300° C. to 600° C.

In some embodiments, a method of fabricating a photovoltaic device comprises: providing a substrate; forming a back contact layer above the substrate; forming an absorber layer above the back contact layer; sputtering a metal layer on the absorber layer, the metal layer comprising one of the group consisting of cadmium, zinc, indium and $Zn_{1-x}Mg_x$; and performing a rapid thermal anneal on the deposited metal layer in an atmosphere comprising sulfur, selenium or oxygen, to form a buffer layer; and forming a front contact layer above the buffer layer.

In some embodiments, the metal layer comprises one of the group consisting of cadmium, indium and zinc, and the atmosphere comprises at least one of the group consisting of sulfur and $H_2S$.

In some embodiments, the metal layer comprises indium, and the atmosphere comprises at least one of the group consisting of selenium and $H_2Se$.

In some embodiments, the metal layer comprises $Zn_{1-x}Mg_x$, and the atmosphere comprises oxygen.

In some embodiments, a photovoltaic device comprises: a substrate, a back contact layer above the substrate, an absorber layer on the back contact layer, a buffer layer on the absorber layer, wherein the absorber has an atomic percentage of an element from the group consisting of sulfur, oxygen and selenium that is greater at an interface between the absorber layer and the buffer layer than the atomic percentage of the element at an interface between the absorber layer and the back contact layer, and a front contact layer above the buffer layer.

In some embodiments, the absorber layer comprises Cu(InGa)SeS or the absorber layer comprises Cu(InGa)Se, the buffer layer comprises one of the group consisting of CdS, ZnS $In2S_3$, $In_2Se_3$, and $Zn_{1-x}Mg_xO$, and the buffer layer has a thickness from 13 nm to about 1300 nm.

In some embodiments, a profile of the atomic percentage of the element in the absorber layer proximate to the interface between the absorber layer and the buffer layer is a continuous curve, and, at the interface, the profile has a same atomic percentage of the element as contained by the buffer layer.

Although the subject matter has been described in terms of exemplary embodiments, it is not limited thereto. Rather, the appended claims should be construed broadly, to include other variants and embodiments, which may be made by those skilled in the art.

What is claimed is:

1. A method of fabricating a buffer layer of a photovoltaic device comprising:
   providing a substrate having a back contact layer disposed above the substrate and an absorber layer disposed above the back contact layer;
   depositing a metal layer comprising cadmium or $Zn_{1-x}Mg_x$ on the absorber layer; and
   performing a thermal annealing treatment on the deposited metal layer in an atmosphere comprising sulfur or oxygen gas to transform the deposited metal layer into a buffer layer.

2. The method of claim 1, wherein the metal layer comprises cadmium, and the atmosphere comprises at least one of the group consisting of sulfur and $H_2S$.

3. The method of claim 1, wherein the atmosphere comprises at least one of the group consisting of sulfur and $H_2S$.

4. The method of claim 1, wherein the metal layer comprises $Zn_{1-x}Mg_x$, and the atmosphere comprises oxygen.

5. The method of claim 1, wherein the step of depositing a metal layer on the absorber layer includes depositing from 1 nm to 1000 nm of metal.

6. The method of claim 1, wherein the step of depositing a metal layer on the absorber layer includes depositing from 5 nm to 500 nm of metal.

7. The method of claim 6, wherein the buffer layer has a thickness in a range from 13 nm to 1300 nm.

8. The method of claim 1, wherein the atmosphere further comprises an inert gas.

9. The method of claim 1, wherein the thermal treatment is a rapid thermal anneal.

10. The method of claim 8, wherein the thermal treatment is a rapid thermal anneal performed at a temperature from 300° C. to 600° C.

11. A method of fabricating a photovoltaic device comprising:
    providing a substrate;
    forming a back contact layer above the substrate;
    forming a copper indium gallium diselenide (CIGS) absorber layer from a plurality of CIGS precursors above the back contact layer;
    sputtering a metal layer on the CIGS absorber layer, the metal layer being an additional indium layer separate from the CIGS precursors ; and
    performing a rapid thermal anneal on the deposited metal layer in an atmosphere comprising sulfur, to form a buffer layer; and
    forming a front contact layer above the buffer layer.

12. The method of claim 11, wherein the atmosphere comprises at least one of the group consisting of sulfur and $H_2S$.

13. A method of fabricating a photovoltaic device comprising:
    providing a substrate;
    forming a back contact layer above the substrate;
    forming an absorber layer above the back contact layer;
    sputtering a metal layer on the absorber layer, the metal layer comprising cadmium; and performing a thermal annealing treatment on the deposited metal layer in an atmosphere comprising sulfur gas, to form a buffer layer; and forming a front contact layer above the buffer layer.

14. The method of claim 13, wherein the atmosphere further comprises an inert gas.

15. The method of claim 1, wherein the thermal treatment is a rapid thermal anneal.

16. The method of claim 11, wherein the step of sputtering a metal layer on the absorber layer includes sputtering from 5 nm to 500 nm of metal.

17. The method of claim 11, wherein the atmosphere further comprises an inert gas.

18. The method of claim 11, wherein the rapid thermal anneal is performed at a temperature from 300° C. to 600° C.

19. The method of claim 13, wherein the step of depositing a metal layer on the absorber layer includes depositing from 5 nm to 500 nm of metal.

20. The method of claim 15, wherein the rapid thermal anneal is performed at a temperature from 300° C. to 600° C.

\* \* \* \* \*